United States Patent
Tanaka et al.

[11] Patent Number: 6,037,700
[45] Date of Patent: Mar. 14, 2000

[54] SURFACE ACOUSTIC WAVE DEVICE

[75] Inventors: Naoki Tanaka, Sakai; Kazuya Niki, Habikino; Fumio Kameoka, Daito; Masami Ikeda, Osaka, all of Japan

[73] Assignee: Sanyo Electric Co., Ltd., Moriguchi, Japan

[21] Appl. No.: 09/049,974

[22] Filed: Mar. 30, 1998

[30] Foreign Application Priority Data

Mar. 31, 1997 [JP] Japan ..................... 9-080212

[51] Int. Cl.[7] ............... H01L 41/04; H03H 9/00
[52] U.S. Cl. ............ 310/313 D; 333/194; 333/195
[58] Field of Search ............... 310/313 D; 333/193, 333/194, 195, 196

[56] References Cited

U.S. PATENT DOCUMENTS

| | | | |
|---|---|---|---|
| 4,635,009 | 1/1987 | Ebata | 333/195 |
| 4,760,359 | 7/1988 | Shiba et al. | 333/194 |
| 4,837,476 | 6/1989 | Mochizuki | 310/313 R |
| 4,978,879 | 12/1990 | Satoh et al. | 310/313 A |
| 5,212,420 | 5/1993 | Hickernell et al. | 310/313 D |
| 5,270,606 | 12/1993 | Cho et al. | 310/313 D |
| 5,313,177 | 5/1994 | Hickernell et al. | 333/193 |
| 5,625,329 | 4/1997 | Koike | 333/195 |
| 5,631,515 | 5/1997 | Mineyoshi et al. | 310/313 B |
| 5,638,036 | 6/1997 | Penunuri et al. | 333/194 |
| 5,731,748 | 3/1998 | Tada | 333/193 |
| 5,760,664 | 6/1998 | Allen | 333/194 |
| 5,874,869 | 2/1999 | Ueda et al. | 333/193 |

FOREIGN PATENT DOCUMENTS 9-093072  4/1997  Japan .

*Primary Examiner*—Elvin Enad
*Assistant Examiner*—Peter Medley
*Attorney, Agent, or Firm*—Armstrong, Westerman, Hattori, McLeland & Naughton

[57] ABSTRACT

A surface acoustic wave device including, as formed on a piezoelectric substrate, one or a plurality of resonators connected together, each of the resonators comprising an interdigital transducer and a grating reflector, the object of the invention is to compact the device by improving the reflection efficiency of the grating reflector. When the grating reflector is a metal strip array reflector of the open type, the grating reflector has an electrode occupancy ratio of 0.7 to 0.8. Alternatively, when a metal strip array reflector of the short-circuit type is used, the grating reflector has an electrode occupancy ratio of 0.45 to 0.55, or when a metal strip array reflector of the interdigital type is used, the grating reflector has an electrode occupancy ratio of 0.7 to 0.85.

5 Claims, 9 Drawing Sheets

SURFACE ACOUSTIC WAVE DEVICE

BACKGROUND OF THE INVENTION

1. Field of the Invention

The present invention relates to surface acoustic wave devices for use in electronic circuits of mobile communications devices and the like. More particularly, the invention relates to surface acoustic wave devices comprising surface acoustic wave resonators.

2. Description of the Related Art

High-frequency devices utilizing surface acoustic waves (SAWs) have found wide use in filters, oscillators and similar electronic circuits for use in mobile communications devices such as portable telephones.

SAW devices in use include those of the resonator type which comprise as formed on a piezoelectric substrate a SAW resonator or a plurality of SAW resonators connected together, the SAW resonator comprising an interdigital transducer (hereinafter referred to briefly as an "IDT") and a grating reflector (hereinafter referred to merely as a "reflector").

FIG. 1A shows the basic construction of SAW resonators which comprises an IDT 1 composed of many pairs of electrode digits 10a, 10b arranged on a piezoelectric substrate 3, and reflectors 2, 2 arranged respectively on opposite sides of the IDT 1.

When a high-frequency voltage is applied across the electrode digits 10a, 10b of the IDT 1, surface acoustic waves are produced in the vicinity of the substrate surface as a result of a piezoelectric effect. The surface acoustic waves are excited most efficiently to propagate on the substrate 3 when the wavelength matches the electrode digit pitch Li of the IDT 1 since the electrodes then excite surface acoustic waves of the same phase.

With SAW devices, therefore, the digit pitch Li is termed an "electrode period."

With reference to FIG. 1A and FIG. 1B, suppose the electrode period of the IDT 1 is Li, the width of electrode digits 10a, 10b of the IDT 1 is Di, the interdigitation length of the electrode digits 10a, 10b is Wi, and the film thickness of the electrodes is Hi.

The reflector 2 embodying the present invention comprises an array of metal strip electrodes 20 formed on a piezoelectric substrate 3 by the same procedure as the IDT 1. Examples of electrode constructions of reflectors 2 include an open type 21 wherein strip electrodes 20 are not connected at their opposite ends as shown in FIG. 2, a short-circuit type 22 wherein strip electrodes 20 are connected together at their opposite ends as shown in FIG. 3, and an interdigital type 23 having the same electrode construction as the IDT 1 as seen in FIG. 4.

The spacing between the electrodes in the reflector 2 is approximately equal to the spacing between the electrode digits in the IDT 1. Accordingly, the length Lg in the reflector 2 corresponding to the electrode period Li of the IDT 1 as shown in FIG. 1B is termed the electrode period of the reflector 2.

With reference to FIG. 1B to FIG. 4, the electrode period of the reflector 2 is Lg, the width of the electrodes is Dg, the interdigitation length of the electrodes is Wg, and the film thickness of the electrodes is Hg.

With the development of mobile communications devices of higher performance and reduced size in recent years, there is a greater need for SAW devices of improved performance in smaller sizes. In reducing the size of SAW devices of the resonator type, it is essential to miniaturize the SAW resonator itself as a component of the device.

The SAW resonator can be miniaturize, for example, by:

(1) using a substrate of low acoustic velocity to give a reduced SAW propagation velocity and thereby shortening the IDT period Li and reflector period Lg, (2) using a substrate which has a large electromechanical coupling factor indicating the ability to convert electric signals to surface acoustic waves and thereby decreasing the number and interdigitation lengths Wi, Wg of electrodes, (3) using an electrode material of higher excitation efficiency and improved reflection efficiency and thereby reducing the number and interdigitation lengths Wi, Wg of electrodes, and (4) using an IDT structure of higher excitation efficiency or a reflector structure of high reflection efficiency and thereby reducing the number and interdigitation lengths Wi, Wg of electrodes.

The measures (1) to (3) require the use of a different substrate material or electrode material, necessitating a great change in the electrode structure or production process, and are therefore not feasible, whereas the resonator can be miniaturized by the measure (4) without greatly altering the conventional method of design or the production process since there is no need to change the material.

Of the parameters which are thought to be relevant to the performance of SAW devices, those associated with the electrodes include the electrode occupancy ratios (the ratio of the electrode area in the region of electrode interdigitation) 2×Di/Li, 2×Dg/Lg, the ratio of the IDT period Li to the reflector period Lg, Li/Lg, and the ratios of the electrode thicknesses Hi and Hg of the IDT and the reflector to the SAW wavelength $\lambda$, Hi/$\lambda$ and Hg/$\lambda$. Accordingly, the inventor conducted experiments on reflectors 2 of the foregoing three different electrode structures (FIGS. 2 to 4) to check the reflectors 2 for SAW reflection efficiency with these parameters altered, and found that the parameters giving an improved reflection efficiency differ from structure to structure, and that especially in the case where the reflector 2 is of the open type 21 (FIG. 2) or of the interdigital type 23 (FIG. 4), the optimum electrode occupancy ratio 2×Dg/Lg is greatly different from the value (about 0.5) conventionally thought optimum.

An object of the present invention is to provide a reflector having a high reflection efficiency for use in SAW devices which comprise as formed on a piezoelectric substrate one or a plurality of resonators connected together, each of the resonators comprising an IDT and a reflector.

SUMMARY OF THE INVENTION

The present invention relates to SAW devices comprising as formed on a piezoelectric substrate one or a plurality of resonators connected together, each of the resonators comprising an IDT and a reflector.

The invention provides as a first aspect thereof a SAW device in which the reflector has an open structure (FIG. 2) and has an electrode occupancy ratio 2×Dg/Lg of 0.7 to 0.8.

In this SAW device, the ratio of the IDT period Li to the reflector period Lg, i.e., Li/Lg, is preferably 0.986 to 0.994. Further the ratio of the film thickness Hg of strip electrodes of the reflector to the SAW wavelength $\lambda$, i.e., Hg/$\lambda$, is preferably at least 0.03.

The invention provides as a second aspect thereof a SAW device in which the reflector has a short-circuit structure (FIG. 3) and has an electrode occupancy ratio 2×Dg/Lg of 0.45 to 0.55.

In this SAW device, the ratio of the IDT period Li to the reflector period Lg, i.e., Li/Lg, is preferably 0.986 to 0.994. Further the ratio of the film thickness Hg of strip electrodes of the reflector to the SAW wavelength λ, i.e., Hg/λ, is preferably at least 0.03.

The invention provides as a third aspect thereof a SAW device in which the reflector has an interdigital structure (FIG. 4) and an electrode occupancy ratio 2×Dg/Lg 0.7 to 0.85.

In this SAW device, the ratio of the IDT period Li to the reflector period Lg, i.e., Li/Lg, is preferably 0.996 to 1.004. Further the ratio of the film thickness Hg of strip electrodes of the reflector to the SAW wavelength λ, i.e., Hg/λ, is preferably at least 0.03.

As will become apparent from the embodiments to be described below, the invention affords reflectors which are improved in reflection efficiency over the conventional ones, reduces the number and interdigitation length of electrodes to provide compacted resonators while permitting the resonators to retain the desired characteristics, consequently providing compacted SAW devices having the required characteristics.

DETAILED DESCRIPTION OF THE INVENTION

1. Experiment

Figure 5:
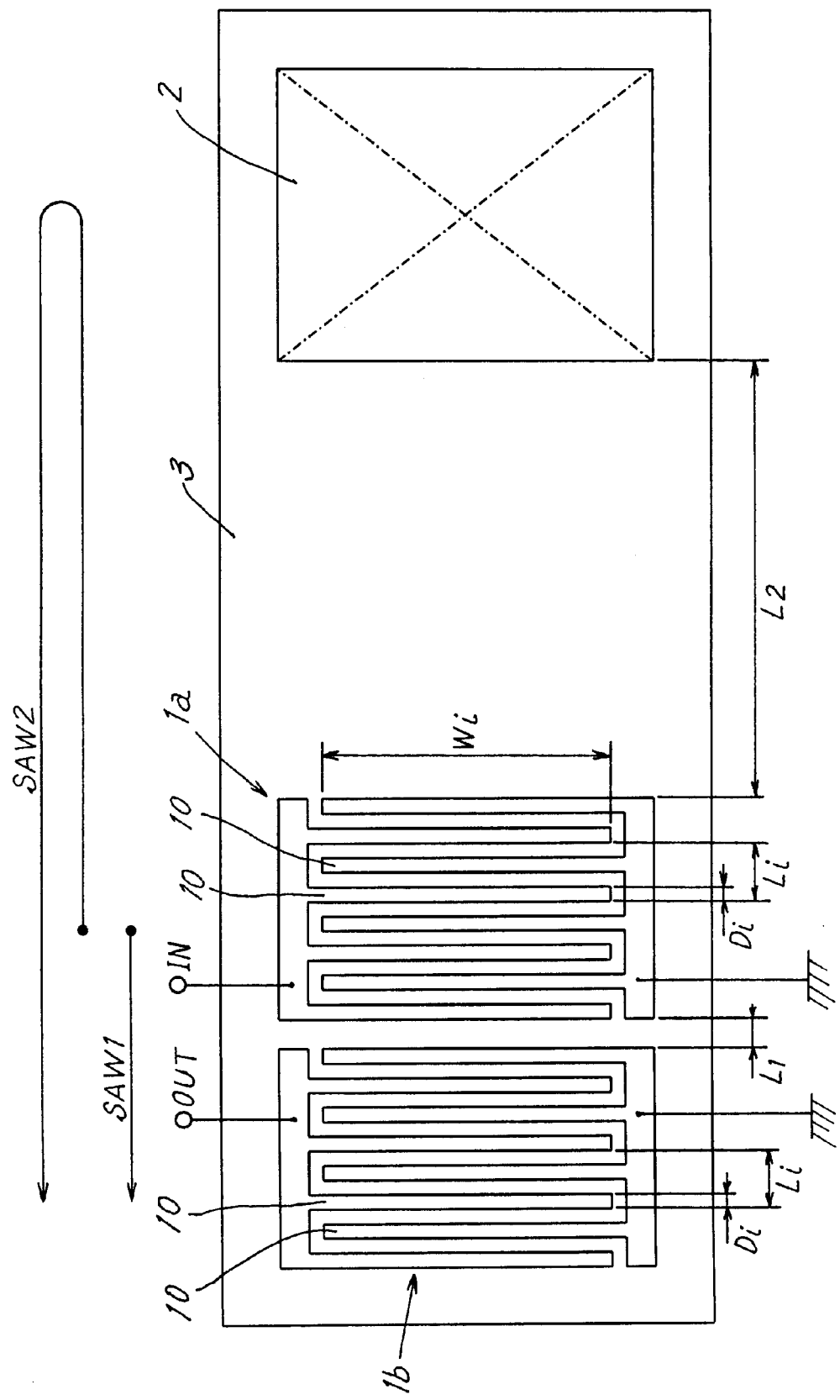
FIG. 5 is a plan view schematically showing an arrangement of IDTs and reflector used for an experiment for measuring reflection efficiencies.

The present invention has been derived from an experiment wherein reflectors were checked for reflection efficiency. FIG. 5 is a plan view showing an arrangement of input IDT 1a, output IDT 1b, reflector 2 and piezoelectric substrate 3 used for the experiment. The input IDT 1a and the output IDT 1b are identical in configuration and dimensions. Each IDT was 21 in the total number of electrode digits and 900 micrometers in the interdigitation length Wi of the electrode digits. An experiment conducted previously revealed that surface acoustic waves were excited most efficiently when the input IDT 1a and the output IDT 1b had an electrode occupancy ratio 2×Di/Li of 0.6, so that the electrode occupancy ratio 2×Di/Li for this experiment was also 0.6. The reflector 2 had a total of fifty strip electrodes (the total number of electrode digits in the case of the reflector 23 of the interdigital type) and 900 micrometers in the interdigitation length Wg of the electrodes. The spacing L1 between the input IDT 1a and the output IDT 1b was 225 micrometers, and the spacing L2 between the input IDT 1a and the reflector 2 was 1269 micrometers. The electrode patterns of the IDTs 1a, 1b and the reflector 2 were formed by aluminum sputtering to equal thicknesses. Quartz of 33° rotation Y cut-X parallel propagation was used for the piezoelectric substrate 3. A network analyzer was used for measuring the power P1 of surface acoustic waves SAW1 emanating from the input IDT 1a and directly reaching the output IDT 1b and the power P2 of surface acoustic waves SAW2 emanating from the input IDT 1a, reflected at the reflector 2 and thereafter reaching the output IDT 1b to determine the reflection efficiency P2/P1.

The frequency at which surface acoustic waves were excited most efficiently was selected for each specimen from among the frequencies in the range of 80 to 90 MHz for use as the frequency of the input voltage.

a. Experimental Results Achieved by Reflector of the Open Type

Figure 1A:
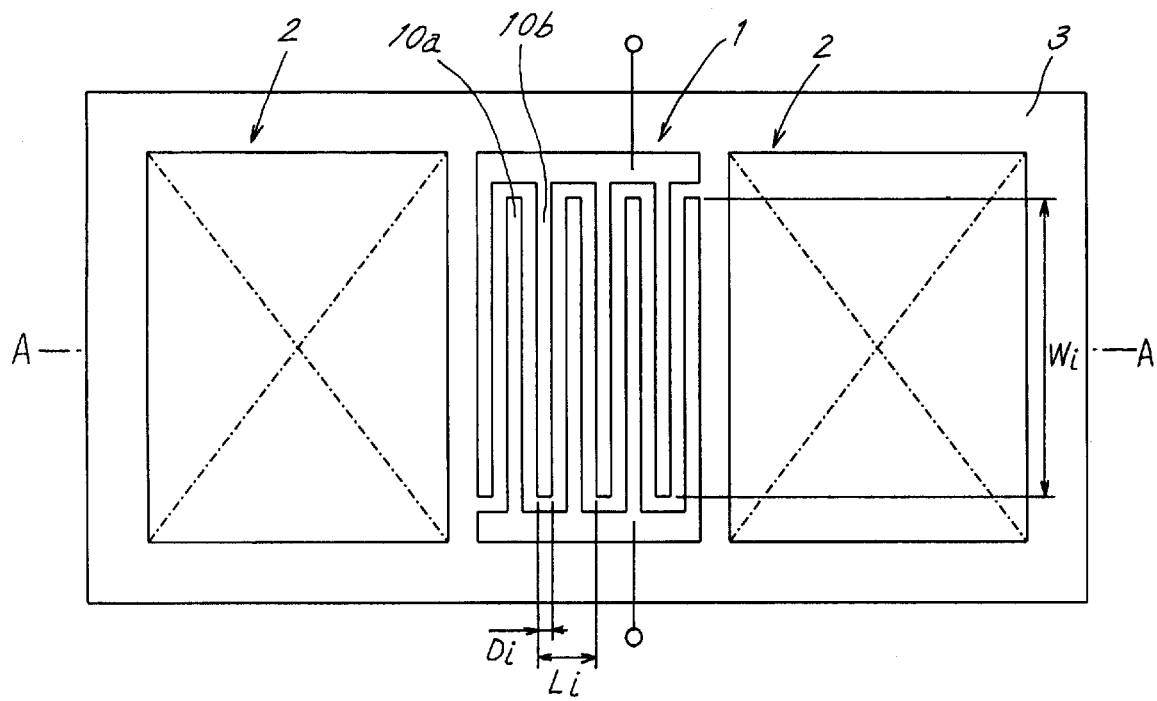
FIG. 1A is a plan view schematically showing a basic resonator comprising an IDT and reflectors which are formed on a piezoelectric substrate.
Figure 1B:
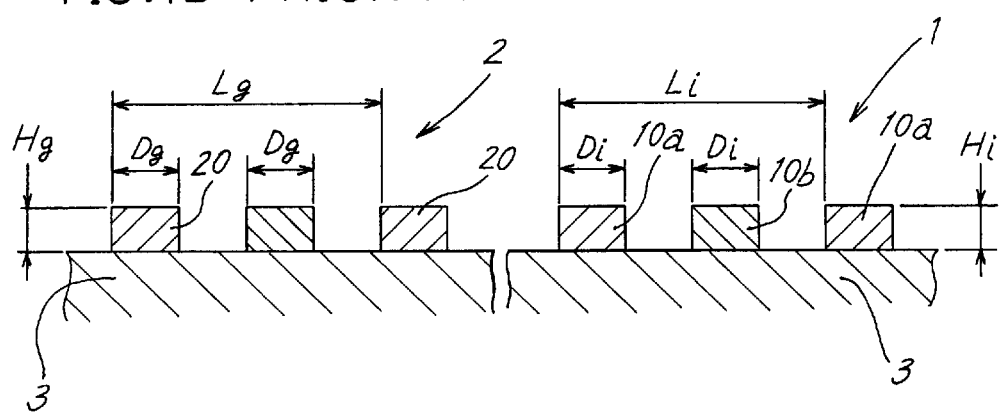
FIG. 1B is an enlarged fragmentary view in section taken along the line A—A in FIG. 1A.
Figure 2:
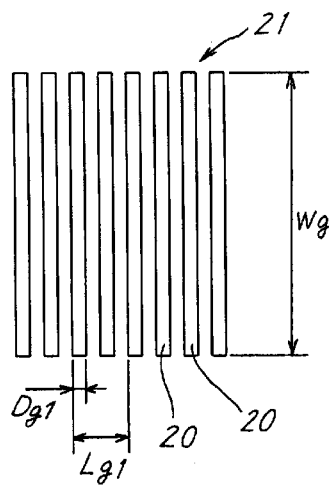
FIG. 2 is a plan view schematically showing a reflector of the open type.

The reflector 2 used was a reflector 21 of the open type as shown in FIG. 2. With the ratio Li/Lg1 of the IDT period Li to the reflector period Lg1 fixed to 1.000, the reflection efficiency P2/P1 was measured at varying electrode occupancy ratios 2×Dg1/Lg1 of the reflector 21 when the ratio H/λ of the electrode film thickness H to the SAW wavelength λ was 0.020, 0.027 or 0.034. The result is shown in the graph of FIG. 6.

Figure 6:
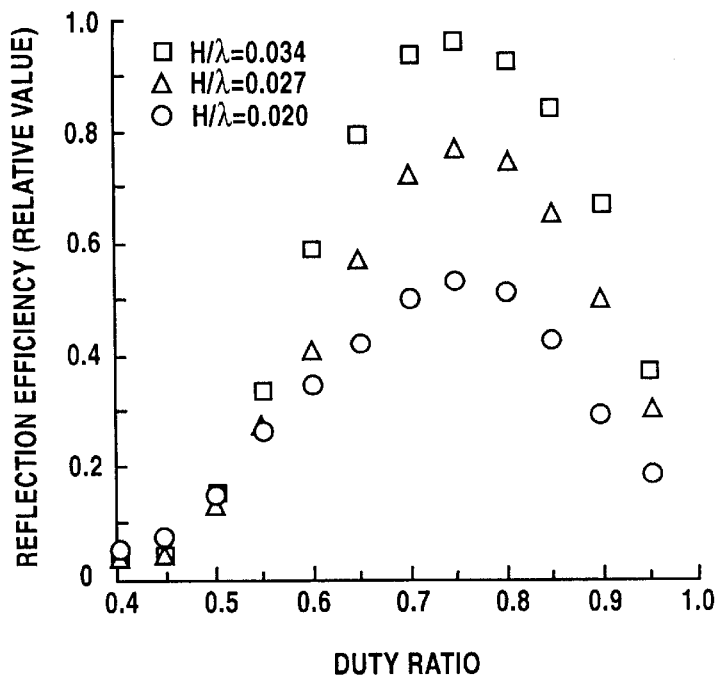
FIG. 6 is a graph showing the electrode occupancy ratio dependence of the reflection efficiency of the reflector of the open type.

FIG. 6 reveals that high reflection efficiencies approximate to a maximum were achieved when the electrode occupancy ratio 2×Dg1/Lg1 of the reflector 21 was 0.7 to 0.8, and that the maximum efficiency was obtained at 0.75.

With the electrode occupancy ratio 2×Dg1/Lg1 of the reflector 21 fixed at 0.75 based on the above result, and with the ratio H/λ of the electrode film thickness H to the SAW wavelength λ set at 0.020, 0.027 or 0.034, the reflection efficiency P2/P1 was measured at varying ratios Li/Lg1 of the IDT period Li to the reflector period Lg1. The result is shown in the graph of FIG. 7.

Figure 7:
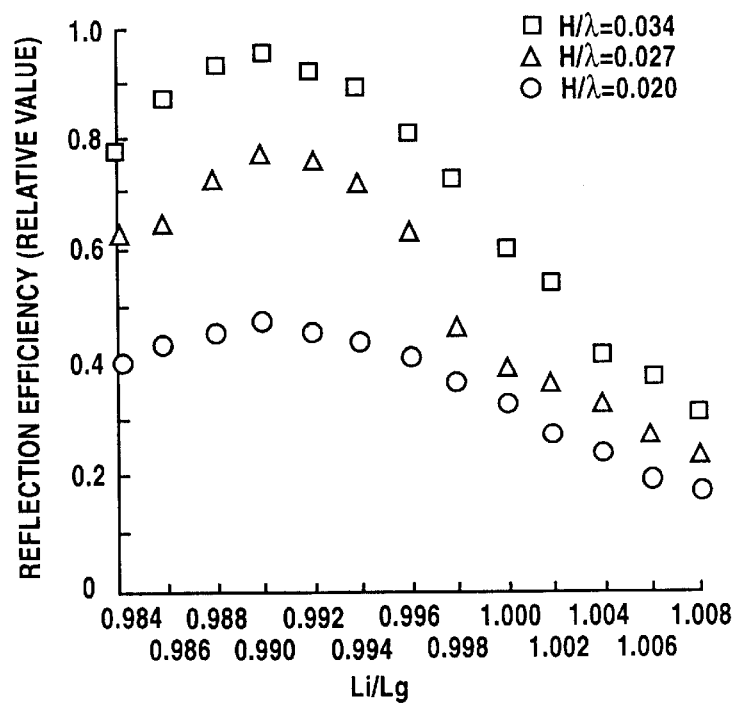
FIG. 7 is a graph showing the Li/Lg dependence of the reflection efficiency of the reflector of the open type.

FIG. 7 indicates that high reflection efficiencies close to a maximum were attained when the ratio Li/Lg1 of the IDT period Li to the reflector period Lg1 was 0.986 to 0.994, and that the maximum efficiency was obtained at 0.990.

Both FIG. 6 and FIG. 7 show that the greater the ratio H/λ of the electrode film thickness H to the SAW wavelength λ, the higher is the reflection efficiency achieved.

These results reveal the following. With SAW resonators having a reflector 21 of the open type, the reflector 21 achieves high reflection efficiencies when the electrode occupancy ratio 2×Dg1/Lg1 of the reflector 21 is 0.7 to 0.8, with the ratio Li/Lg1 of the IDT period Li to the reflector period Lg1 in the range of 0.986 to 0.994 and with the ratio H/λ of the electrode film thickness H to the SAW wavelength λ having a value of at least 0.03. Above all, the reflector 21 attains the highest reflection efficiency when the electrode occupancy ratio 2×Dg1/Lg1 of the reflector 21 is 0.75, with the ratio Li/Lg1 of the IDT period Li to the reflector period Lg1 having a value of 0.990.

b. Experimental Results Achieved by Reflector of the Short-Circuit Type

Figure 3:
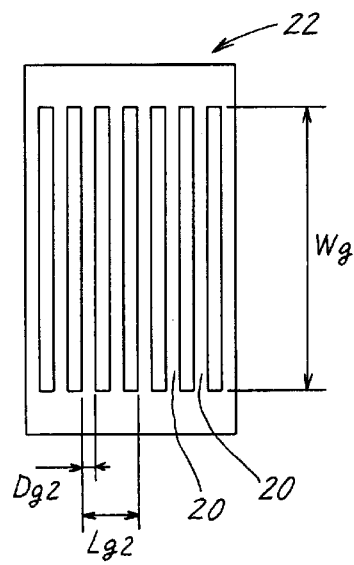
FIG. 3 is a plan view schematically showing a reflector of the short-circuit type.

The reflector 2 next used was a reflector 22 of the short-circuit type as shown in FIG. 3. With the ratio Li/Lg2 of the IDT period Li to the reflector period Lg2 fixed to 1.000, the reflection efficiency P2/P1 was measured at varying electrode occupancy ratios 2×Dg2/Lg2 of the reflector 22 when the ratio H/λ of the electrode film thickness H to the SAW wavelength λ was 0.020, 0.027 or 0.034. The result is shown in the graph of FIG. 8.

Figure 8:
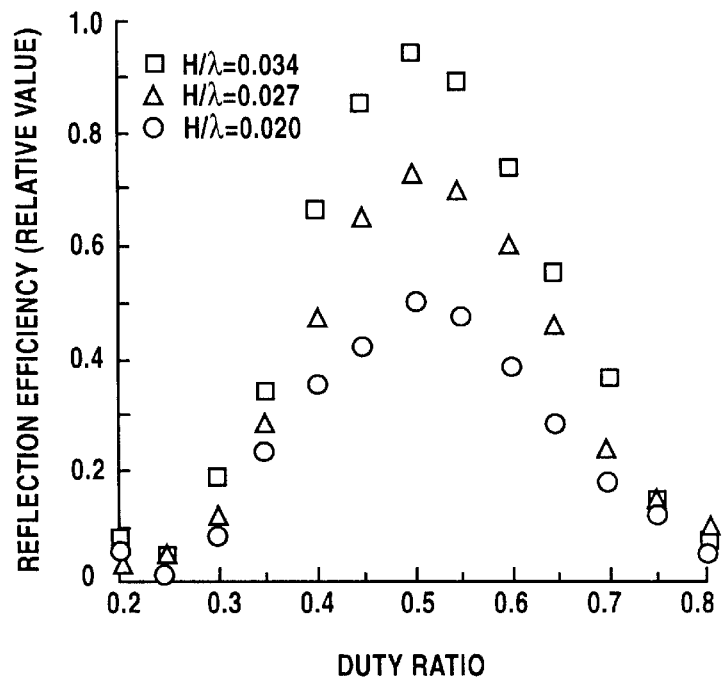
FIG. 8 is a graph showing the electrode occupancy ratio dependence of the reflection efficiency of the reflector of the short-circuit type.

FIG. 8 reveals that high reflection efficiencies approximate to a maximum were achieved when the electrode occupancy ratio 2×Dg2/Lg2 of the reflector 22 was 0.45 to 0.55, and that the maximum efficiency was obtained at 0.5.

With the electrode occupancy ratio 2×Dg2/Lg2 of the reflector 22 fixed at 0.5 based on the above result, and with the ratio H/λ of the electrode film thickness H to the SAW wavelength λ set at 0.020, 0.027 or 0.034, the reflection efficiency P2/P1 was measured at varying ratios Li/Lg2 of the IDT period Li to the reflector period Lg2. The result is shown in the graph of FIG. 9.

Figure 9:
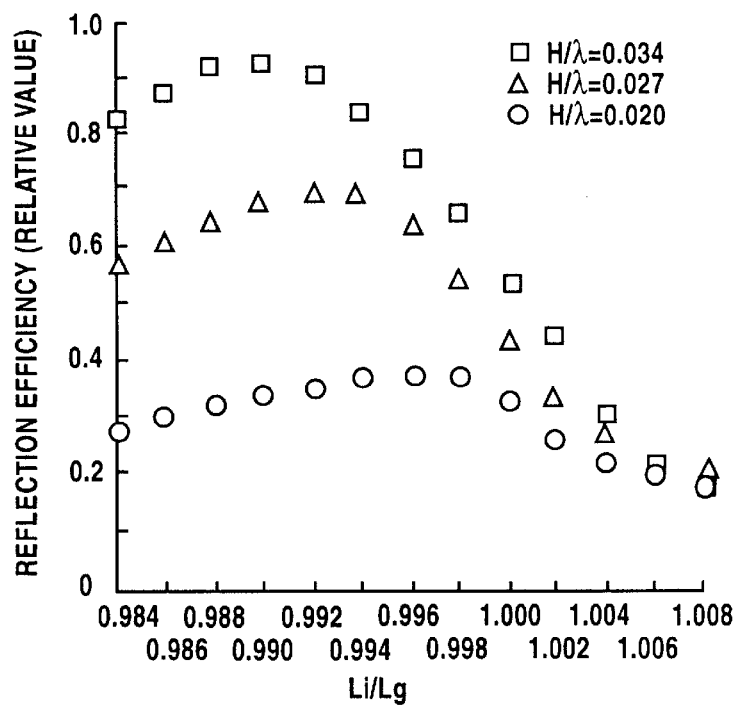
FIG. 9 is a graph showing the Li/Lg dependence of the reflection efficiency of the reflector of the short-circuit type.

FIG. 9 indicates that high reflection efficiencies close to a maximum were attained when the ratio Li/Lg2 of the IDT period Li to the reflector period Lg2 was 0.986 to 0.994, and that the maximum efficiency was obtained at 0.990.

Both FIG. 8 and FIG. 9 show that the greater the ratio H/λ of the electrode film thickness H to the SAW wavelength λ, the higher is the reflection efficiency achieved.

These results reveal the following. With SAW resonators having a reflector 22 of the short-circuit type, the reflector 22 achieves high reflection efficiencies when the electrode occupancy ratio 2×Dg2/Lg2 of the reflector 22 is 0.45 to 0.55, with the ratio Li/Lg2 of the IDT period Li to the reflector period Lg2 in the range of 0.986 to 0.994 and with the ratio H/λ of the electrode film thickness H to the SAW wavelength λ having a value of at least 0.03. Above all, the reflector 22 attains the highest reflection efficiency when the electrode occupancy ratio 2×Dg2/Lg2 of the reflector 22 is 0.5, with the ratio Li/Lg2 of the IDT period Li to the reflector period Lg2 having a value of 0.990.

c. Experimental Results Achieved by Reflector of the Interdigital Type

Figure 4:
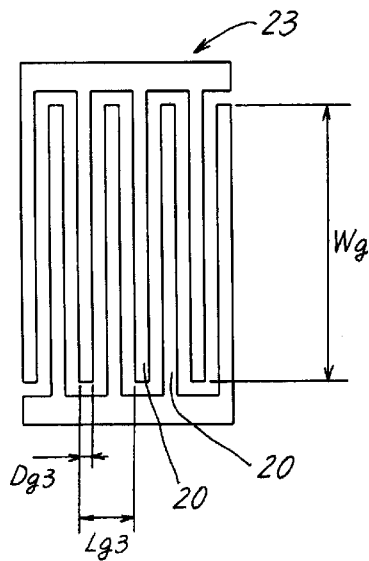
FIG. 4 is a plan view schematically showing a reflector of the interdigital type.

The reflector 2 next used was a reflector 23 of the interdigital type as shown in FIG. 4. With the ratio Li/Lg3 of the IDT period Li to the reflector period Lg3 fixed to 1.000, the reflection efficiency P2/P1 was measured at varying electrode occupancy ratios 2×Dg3/Lg3 of the reflector 23 when the ratio H/λ of the electrode film thickness H to the SAW wavelength λ was 0.020, 0.027 or 0.034. The result is shown in the graph of FIG. 10.

Figure 10:
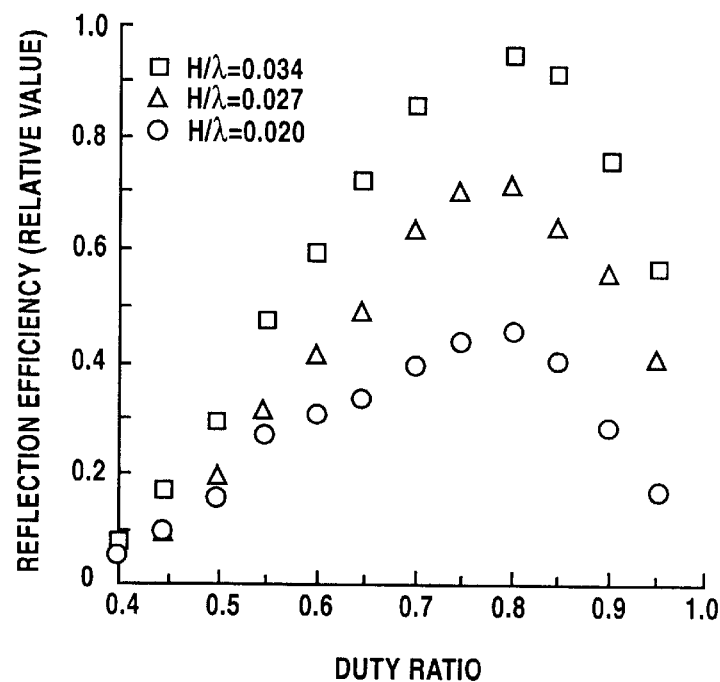
FIG. 10 is a graph showing the electrode occupancy ratio dependence of the reflection efficiency of the reflector of the interdigital type.

FIG. 10 reveals that high reflection efficiencies approximate to a maximum were achieved when the electrode occupancy ratio 2×Dg3/Lg3 of the reflector 23 was 0.7 to 0.85, and that the maximum efficiency was obtained at 0.8.

With the electrode occupancy ratio 2×Dg3/Lg3 of the reflector 23 fixed at 0.8 based on the above result, and with the ratio H/λ of the electrode film thickness H to the SAW wavelength λ set at 0.020, 0.027 or 0.034, the reflection efficiency P2/P1 was measured at varying ratios Li/Lg3 of the IDT period Li to the reflector period Lg3. The result is shown in the graph of FIG. 11.

Figure 11:
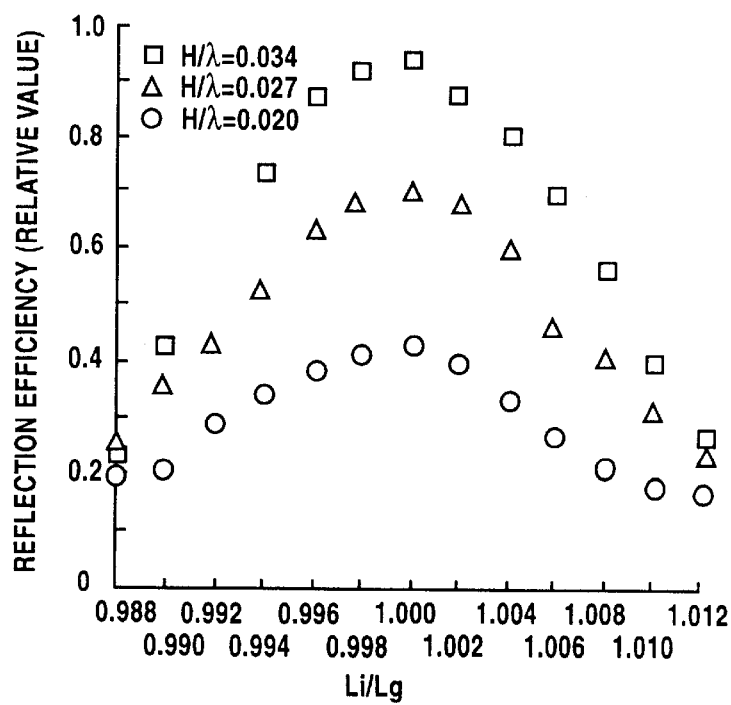
FIG. 11 is a graph showing the Li/Lg dependence of the reflection efficiency of the reflector of the interdigital type.

FIG. 11 indicates that high reflection efficiencies close to a maximum were attained when the ratio Li/Lg3 of the IDT period Li to the reflector period Lg3 was 0.998 to 1.002, and that the maximum efficiency was obtained at 1.000.

Both FIG. 10 and FIG. 11 show that the greater the ratio H/λ of the electrode film thickness H to the SAW wavelength λ, the higher is the reflection efficiency achieved.

These results reveal the following. With SAW resonators having a reflector 23 of the interdigital type, the reflector 23 achieves high reflection efficiencies when the electrode occupancy ratio 2×Dg3/Lg3 of the reflector 23 is 0.7 to 0.85, with the ratio Li/Lg3 of the IDT period Li to the reflector period Lg3 in the range of 0.998 to 1.002 and with the ratio H/λ of the electrode film thickness H to the SAW wavelength λ having a value of at least 0.03. Above all, the reflector 23 attains the highest reflection efficiency when the electrode occupancy ratio 2×Dg3/Lg3 of the reflector 23 is 0.8, with the ratio Li/Lg3 of the IDT period Li to the reflector period Lg3 having a value of 1.000.

2. Examples

A description will be given of the present invention as embodied into a SAW filter of the resonator type. According to the coupling between resonators, resonator-type SAW filters are divided into the transversely-coupled double-mode resonator type SAW filters, longitudinally-coupled double-mode resonator type SAW filters, ladder type SAW filters, etc. Although the invention will be described as applied to a transversely-coupled double-mode resonator type SAW filter, the invention is of course similarly applicable to SAW filters of other resonator-types.

Figure 12:
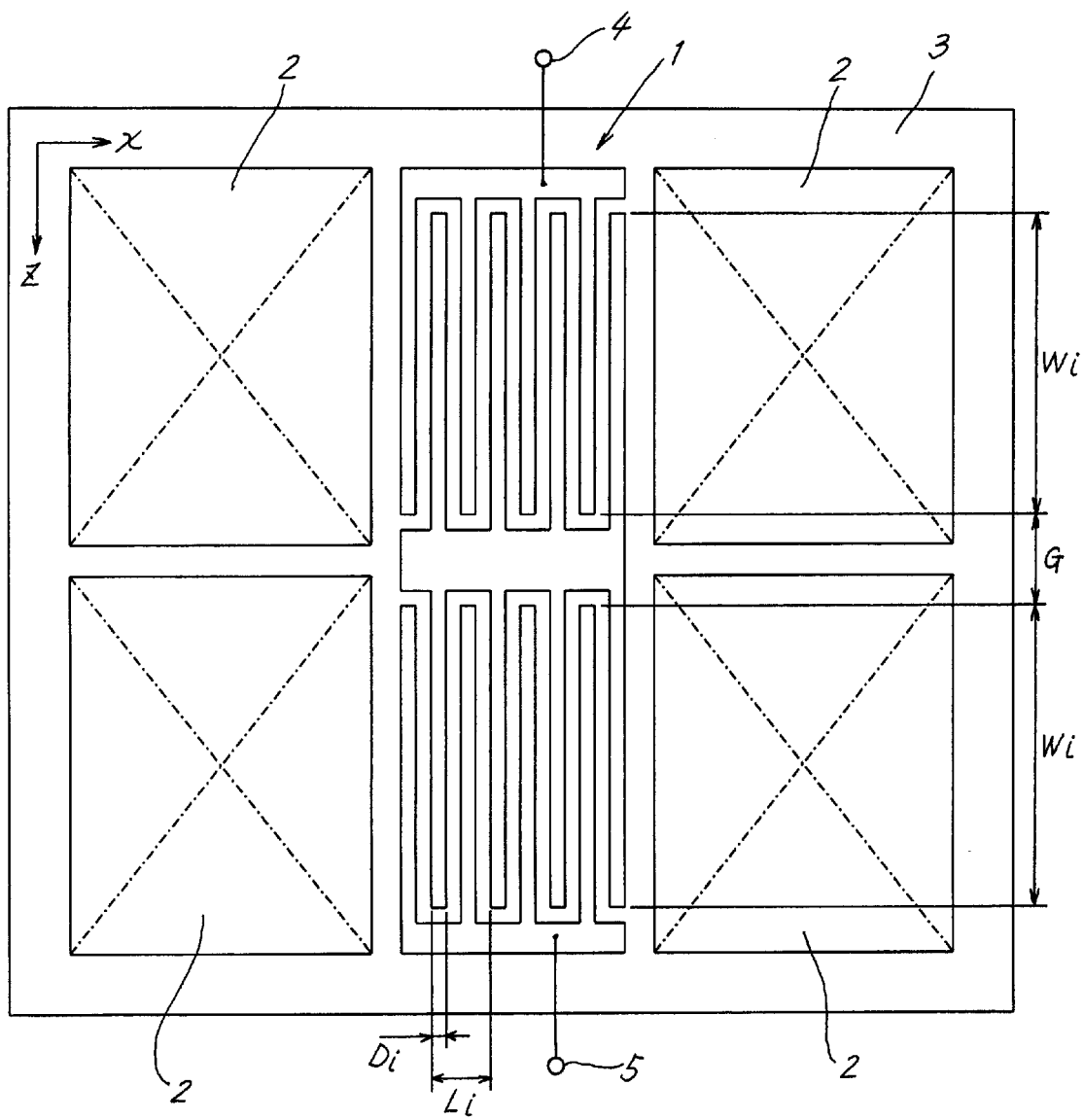
FIG. 12 is a plan view schematically showing a SAW filter of the transversely-coupled double-mode resonator type.

With reference to FIG. 12 showing the transversely-coupled double-mode resonator type SAW filter, two resonators each comprising an IDT 1 and reflectors 2, 2 arranged at opposite sides thereof are closely juxtaposed in a direction (z-direction) perpendicular to the direction of propagation of surface acoustic waves (x-direction), whereby two kinds of waves, i.e., waves of symmetric mode and anti-symmetric mode, are caused to propagate in the z-direction to obtain a match between anti-resonance frequencies of symmetric mode and resonance frequencies of anti-symmetric mode and to provide a band-pass filter between an input terminal 4 and an output terminal 5. Two filters of the construction shown in FIG. 12 are usually used as connected together in series so as to suppress signals fully effectively outside the band.

a. Example of the Invention

The transversely-coupled double-mode resonator type SAW filter embodying the invention has the following construction. The IDT 1 is 234 in the total number of electrode digits, 333 micrometers in the interdigitation length Wi of the electrode digits, 0.6 in electrode occupancy ratio 2×Di/Li as in the above experiment, and 37 micrometers in gap G. The reflector 2, which is a reflector 21 of the open type as shown in FIG. 2, is 50 in the number of electrodes, and 0.75 in electrode occupancy ratio 2×Dg1/Lg1. The ratio Li/Lg1 of the IDT period Li to the reflector period Lg1 is 0.990, and the ratio H/λ of the electrode film thickness H to the SAW wavelength λ is 0.034. When the SAW filter was checked for pass characteristics, the graph of FIG. 13 was obtained.

b. Comparative Example 1

Comparative Example 1 is the same as the example of the invention except the dimensions of the reflector 21. More specifically, the reflector 21 is has an electrode occupancy ratio 2×Dg1/Lg1 of 0.5, and the ratio Li/Lg1 of the IDT period Li to the reflector period Lg1 is 1.000. The reflector 21 used is the same as the conventional reflector in these particulars. The reflector 21 is 50 in the number of electrodes, and the ratio H/λ of the electrode film thickness H to the SAW wavelength λ is 0.034, as in the case of the example of the invention. When the SAW filter was checked for pass characteristics, the graph of FIG. 14 was obtained.

c. Comparative Example 2

Comparative Example 2 is the same as Comparative Example 1 except the difference that the reflector 21 used has the same number of electrodes as the conventional reflector, i.e., 114 electrodes. When the SAW filter was checked for pass characteristics, the graph of FIG. 15 was obtained.

Figure 13:
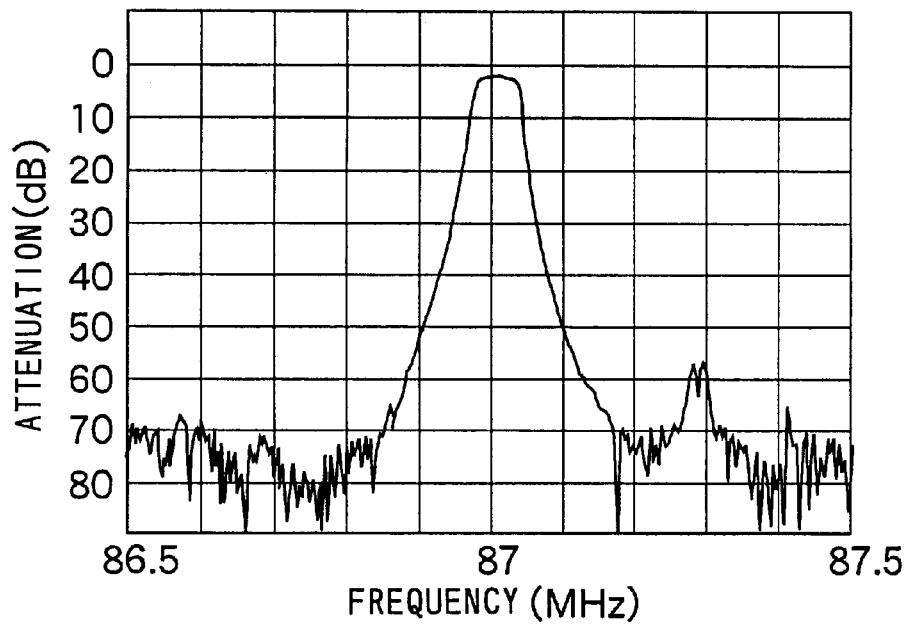
FIG. 13 is a characteristics diagram of a SAW filter of the transversely-coupled double-mode resonator type embodying the invention.
Figure 14:
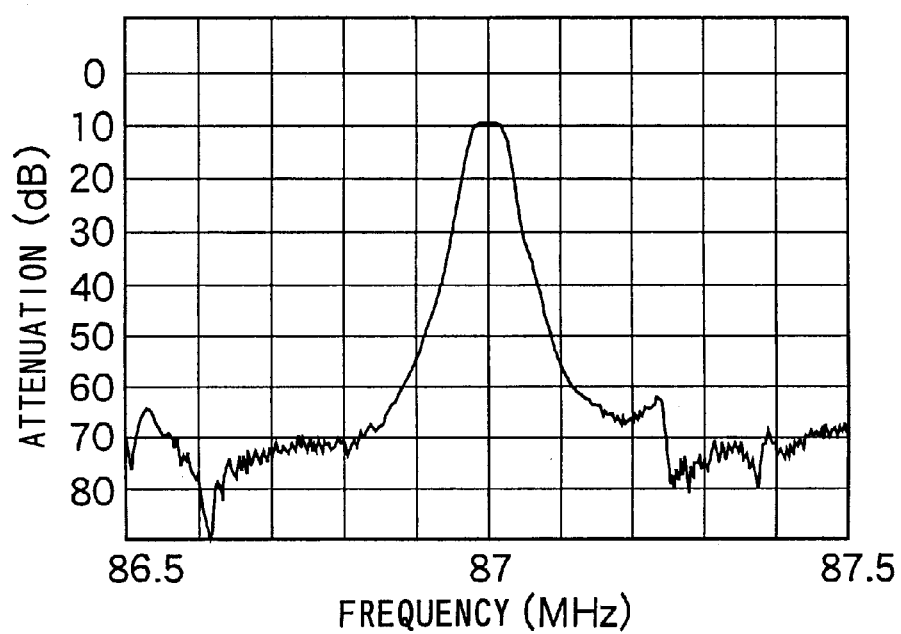
FIG. 14 is a characteristics diagram of a SAW filter of the transversely-coupled double-mode resonator type of Comparative Example 1.
Figure 15:
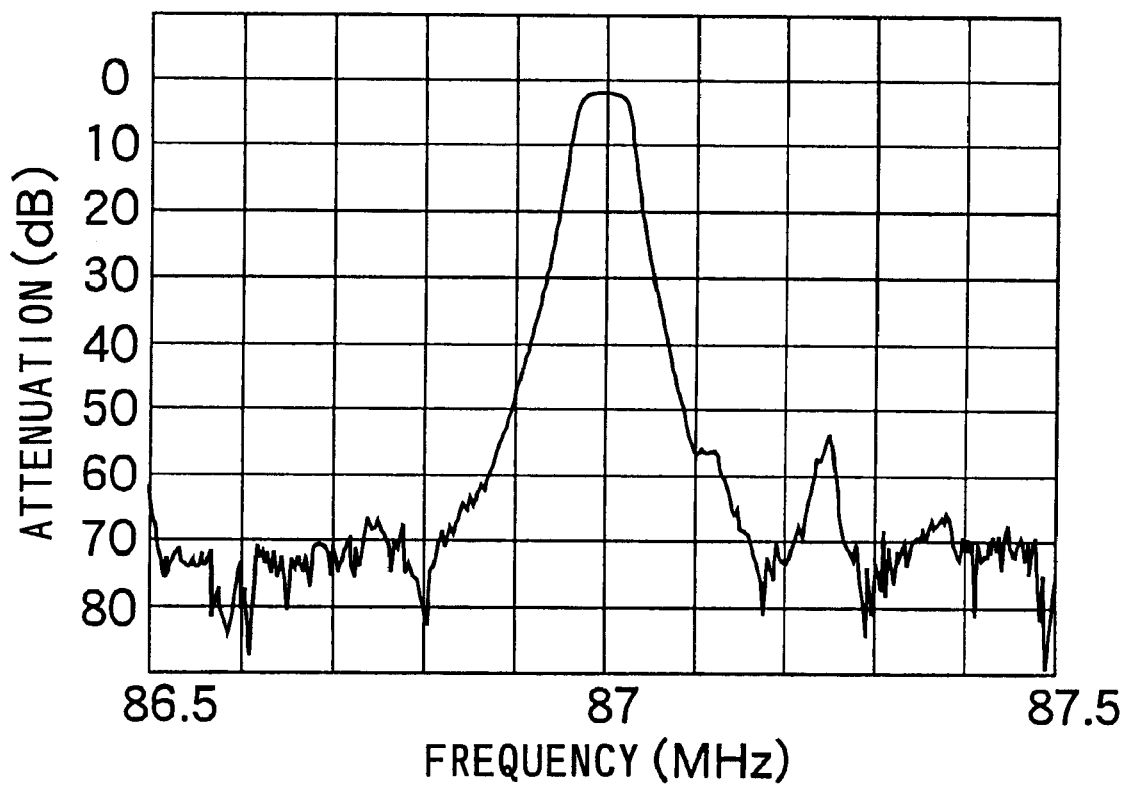
FIG. 15 is a characteristics diagram of a SAW filter of the transversely-coupled double-mode resonator type of Comparative Example 2.

A comparison between FIG. 13 and FIG. 14 reveals that the example of the invention, which is equal to Comparative Example 1 in the number of electrodes of the reflector, is less in attenuation and has more excellent pass characteristics with respect to insertion loss. A further comparison between FIG. 13 and FIG. 15 shows that the example of the invention, although smaller than one-half of Comparative Example 2 in the number of electrodes of the reflector, is comparable or superior to Comparative Example 2 in pass characteristics in respect of insertion loss, pass bandwidth and suppression outside the band.

In SAW devices which comprise as formed on a piezoelectric substrate one or a plurality of resonators connected together and wherein the resonators each comprise an IDT and reflectors, the present invention improves the reflection efficiency per reflector, making it possible to use reflectors having a smaller number of electrodes than conventionally while permitting the device to retain the desired characteristics. Thus, the invention realizes compacted resonators to provide devices of reduced size.

The embodiments described above are intended to illustrate the present invention and should not be construed as limiting the invention set forth in the appended claims or reducing the scope thereof. The devices of the invention are not limited to the embodiments in construction but can of course be modified variously within the technical scope defined in the claims.

What is claimed is:

1. A surface acoustic wave device comprising, as formed on a piezoelectric substrate:

one or a plurality of resonators connected together, each of the resonators comprising an interdigital transducer and a grating reflector, wherein the grating reflector is a metal strip array reflector of the open type and having an electrode occupancy ratio 2×Dg/Lg of 0.7 to 0.8, where Dg is the width of each electrode and Lg is the electrode period, and wherein the ratio Li/Lg of the electrode period Li of the interdigital transducer to the electrode period Lg of the grating reflector is 0.986 to 0.994.

2. A surface acoustic wave device according to claim 1, wherein the ratio Hg/λ of the electrode film thickness Hg of the grating reflector to the wavelength λ of the surface acoustic waves is at least 0.03.

3. A surface acoustic wave device comprising, as formed on a piezoelectric substrate:

one or a plurality of resonators connected together, each of the resonators comprising an interdigital transducer and a grating reflector, wherein the grating reflector is a metal strip array reflector of the interdigital type and has an electrode occupancy ratio 2×Dg/Lg of 0.7 to 0.85, where Dg is the width of each electrode and Lg is the electrode period.

4. A surface acoustic wave device according to claim 3, wherein the ratio Li/Lg of the electrode period Li of the interdigital transducer to the electrode period Lg of the grating reflector is 0.996 to 1.004.

5. A surface acoustic wave device according to claim 4, wherein the ratio Hg/λ of the electrode film thickness Hg of the grating reflector to the wavelength λ of the surface acoustic waves is at least 0.03.

* * * * *